United States Patent
Kawabata et al.

[11] Patent Number: 5,141,903
[45] Date of Patent: Aug. 25, 1992

[54] PYROELECTRIC CERAMIC COMPOSITION

[75] Inventors: Akira Kawabata, Uji; Tadashi Shiosaki, Kyoto; Tamotsu Ueyama, Oyama; Mikiya Ono, Tokorozawa, all of

[73] Assignee: Mitsubishi Mining and Cement Co. Ltd., Tokyo, Japan

[21] Appl. No.: 502,914

[22] Filed: Apr. 2, 1990

[30] Foreign Application Priority Data

Mar. 31, 1989 [JP] Japan .................. 1-78192
Mar. 31, 1989 [JP] Japan .................. 1-78193

[51] Int. Cl.$^5$ ............................ C04B 35/49
[52] U.S. Cl. ..................... 501/134; 501/32; 252/62.9
[58] Field of Search ............ 501/134, 32; 252/62.9

[56] References Cited

FOREIGN PATENT DOCUMENTS

| | | | |
|---|---|---|---|
| 51-43199 | 11/1976 | Japan | 252/62.9 |
| 0018400 | 7/1979 | Japan | 252/62.9 |
| 7105716 | 11/1971 | Netherlands | 252/62.9 |
| 1200825 | 8/1970 | United Kingdom | 252/62.9 |

Primary Examiner—Mark L. Bell
Assistant Examiner—Deborah Jones
Attorney, Agent, or Firm—Hoffman, Wasson & Gitler

[57] ABSTRACT

There is provided a pyroelectric ceramic composition of the general formula:

$$X - PbZrO_3 - Y - Pb(Zn_{\frac{1}{3}}NB_{\frac{2}{3}})O_3 - Z - PbTiO_3$$

where $X+Y+Z=1$, $X=0.07$, $0.82 \leq X \leq 0.93$, $0 < Y \leq 0.11$, and having both of high pyroelectric constant and the second transition temperature below its Curie's temperature. Further, the material comprising the combination of the fired powders having the different compositions of the above formula, each from the other can be more useful.

2 Claims, 2 Drawing Sheets

PYROELECTRIC CERAMIC COMPOSITION

FIELD OF THE INVENTION

The present invention relates to a specific pyroelectric ceramic composition. Particularly, it relates to a pyroelectric composition having a high pyroelectric constant, and a second transition temperature below its Curie's temperature.

DESCRIPTION OF THE PRIOR ART

Generally speaking, a pyroelectric ceramic composition belongs to the class of ferroelectric materials which have a Curie's point at which the pyroelectric coefficient, and dielectric constant are at the maximum value that is due to the crystal phase transition of ferroelectric phase to antiferroelectric phase.

Solid solution ceramics such as $PbTiO_3$ and $PbTiO_3$—$PbZrO_3$ are typical pyroelectric ceramics having relatively high pyroelectric coefficients for the phase transition temperature. Therefore, such pyroelectric materials are useful in an infrared sensor.

More particularly, these ceramics are used for pyroelectric sensors manufactured through mass production and which require high sensitivity (such as an invasion detector or a temperature sensor usable in an electronic cooking range). A pyroelectric material which can detect the radiation from long distances and which is not affected by the circumference temperature is highly desired.

The prior art pyroelectric materials are explained as follows: Tri-glycine sulphate crystal (TGS) has: a) relatively significant performance in properties such as the pyroelectric constant (P), the dielectric constant ($\epsilon_r$), and the volume specific heat ($C_v$); b) absorption of radiation above 2 microns in wavelength; and c) relative ease in fabrication. However, TGS is: a) a water soluble crystal; b) costly in preparation; and c) its Curie's point is present at low temperature, i.e. at 49° C., and therefore, it is not a practical nor commercialized pyroelectric material. Crystalline material such as $LiTaO_3$, $LiNbO_3$, and $Sr_{1-x}Ba_xNb_6O_{15}$ can be listed as pyroelectric materials without these shortcomings. Particularly $LiTaO_3$ and $LiNbO_3$ have a relatively high Curie's point, they do not have the shortcomings of TGS, and they have a relatively low dielectric constant, and therefore, stable performance in the range of the transition temperature. Because of their crystalline material, these materials can be obtained with high reproducibility.

Such crystals have shortcomings as follows: a) they are costly to prepare because of the used Czochralski method for crystal growth; b) a large scale of crystals cannot be prepared; and c) the pyroelectric constant is low in the other range than Curie's point range, therefore, the sensitivity will be unacceptably low when the area for the detector is small.

On the other hand, solid solution ceramics such as $PbTiO_3$ and $PbTiO_3$—$PbZrO_3$ are typical pyroelectric ceramics, and have a high Curie's point, high intrinsic polarization, and relatively low dielectric constants (e.g. about 200 to 450).

However, the pyroelectric constant of $PbTiO_3$ is about $2 \times 10^{-8}$/°C./cm$^2$ and therefore, is a low value, and has the shortcoming of having a lower sensitivity. PZT ceramics have a relatively high dielectric constant such as 800 to 1,000, which will lower the sensitivity.

The fundamental requirements for a conventional pyroelectric material are as follows: 1) they should have a high pyroelectric constant; and 2) a high detectivity on a target (the value corresponding to S/N). However, in the conventional pyroelectric material, the characteristics thereof will significantly change when the temperature to be measured is changed. Therefore, a device using conventional pyroelectric material would not be adaptable to changing circumstances in which the temperature is naturally changed in a variety of ranges, and therefore it is not practical to use this material under a variety of conditions.

Generally speaking, a pyroelectric material has a Curie's point, and a higher pyroelectric constant at the Curie's point. Further, an ordinary pyroelectric ceramic material exhibits drastic increases in the dielectric constant at the Curie's point range, and therefore, sensitivity is significantly changed against the change in temperature due to a change in circumstances, and as a result, stability is lowered.

At a temperature range higher than the Curie's point, polarization will disappear so that the pyroelectric coefficient will be zero. Accordingly, the temperature range in which pyroelectricity (pyroelectric performance) can be utilized to measure the temperature, should be a range of 100° C., or more, lower than the Curie's point. However, the pyroelectric coefficient of known pyroelectric ceramics may be at its highest, $5 \times 10^{-8}$/°C./cm$^2$, or less, in the above-mentioned range. PZT has a pyroelectric coefficient of $10 \times 10^{-8}$/°C./cm$^2$, but a dielectric constant of 1,000 to 1,400, and therefore, the performance, e.g. which is the sensitivity to the voltage, is significantly low.

Further, PZT composition having the ratio of Pb:Zr:Ti=96:4 to 70:30 has been recently studied in order to improve its pyroelectric performance. It has been found that this composition has a second transition temperature in the temperature range of 40° C. to 110° C., at the transition temperature of which the ferroelectric crystal phase transforms into another ferroelectric crystal phase, and a pyroelectric coefficient corresponding to the composition which has the maximum value at this second transition temperature. However, the PZT composition has shortcomings in that when the second transition temperature is changed to be higher, the pyroelectric coefficient is changed to be lower, and further, the sensitivity to temperature becomes lower.

There have been many proposals to utilize heat radiation such as infrared radiation emitted from a material, and detect the temperature of the material without contact, to produce a temperature sensor. The demand for such sensor has been advanced.

There has been a great desire to develop a sensor which performs this way for a wide variety of applications including: 1) accident prevention such as an invasion detector; 2) a fire detector; 3) a laser power meter; 4) pyrovision; 5) a radiation thermometer; 6) a device to detect vertical temperature distribution; and 7) a non-contact temperature detector for use in an electric cooking range.

A temperature sensor which uses a pyroelectric material is a sensor which can meet this need. The pyroelectric temperature sensor has the following features: 1) it is usable in a room temperature; 2) it has independence of wavelength for detecting radiation; 3) it does not need a light source such as a photocell and a phototube; and 4) it detects the material to be measured without any attachment. Therefore, such a pyroelectric temperature sensor has recently become of significant interest.

Generally speaking, a pyroelectric constant is lower at a temperature range approximate to the room temperature, and increases drastically near to the Curie's temperature, and maximizes at the Curie's point. Further, a pyroelectric constant will be lowered to zero with an increase in the temperature above Curie's point.

The intrinsic polarization will decrease with increase of the temperature, and will be approximately zero above Curie's point. The dielectric constant has its general tendency similar to that of the pyroelectric constant, and maximizes at Curie's point.

SUMMARY OF THE INVENTION

With the foregoing considerations in mind, the present invention contemplates the provision of a new pyroelectric ceramic composition to conquer the shortcomings of prior art pyroelectric materials.

It is an object of the present invention to provide a pyroelectric composition having: 1) a low dielectric constant in the specific temperature range of from minus 10° C. to 110° C.; 2) a high pyroelectric coefficient P; 3) high performance, e.g. high sensitivity; and 4) stable pyroelectric properties in the temperature range of from minus 10° C. to 110° C.

It is another object of the present invention to provide a pyroelectric ceramic material which comprises the combination of pyroelectric compositions which are different from one another.

The essence of the invention resides in the discovery that a composition of the formula:

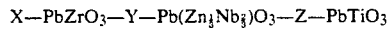

where $X+Y+Z=1$, $Z=0.07$, $0.82 \leq X \leq 0.93$, $0 < Y \leq 0.11$ has a second transition temperature in a wide temperature range, where the second transition temperature can be controlled by adjusting the value of $Y$ (the content of $Pb(Zn_{\frac{1}{3}}Nb_{\frac{2}{3}})O_3$).

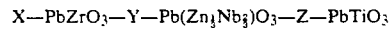

where $X+Y+Z=1$, $Z=0.07$, $0.82 \leq X \leq 0.93$, $0 < Y \leq 0.11$.

Figure 2:
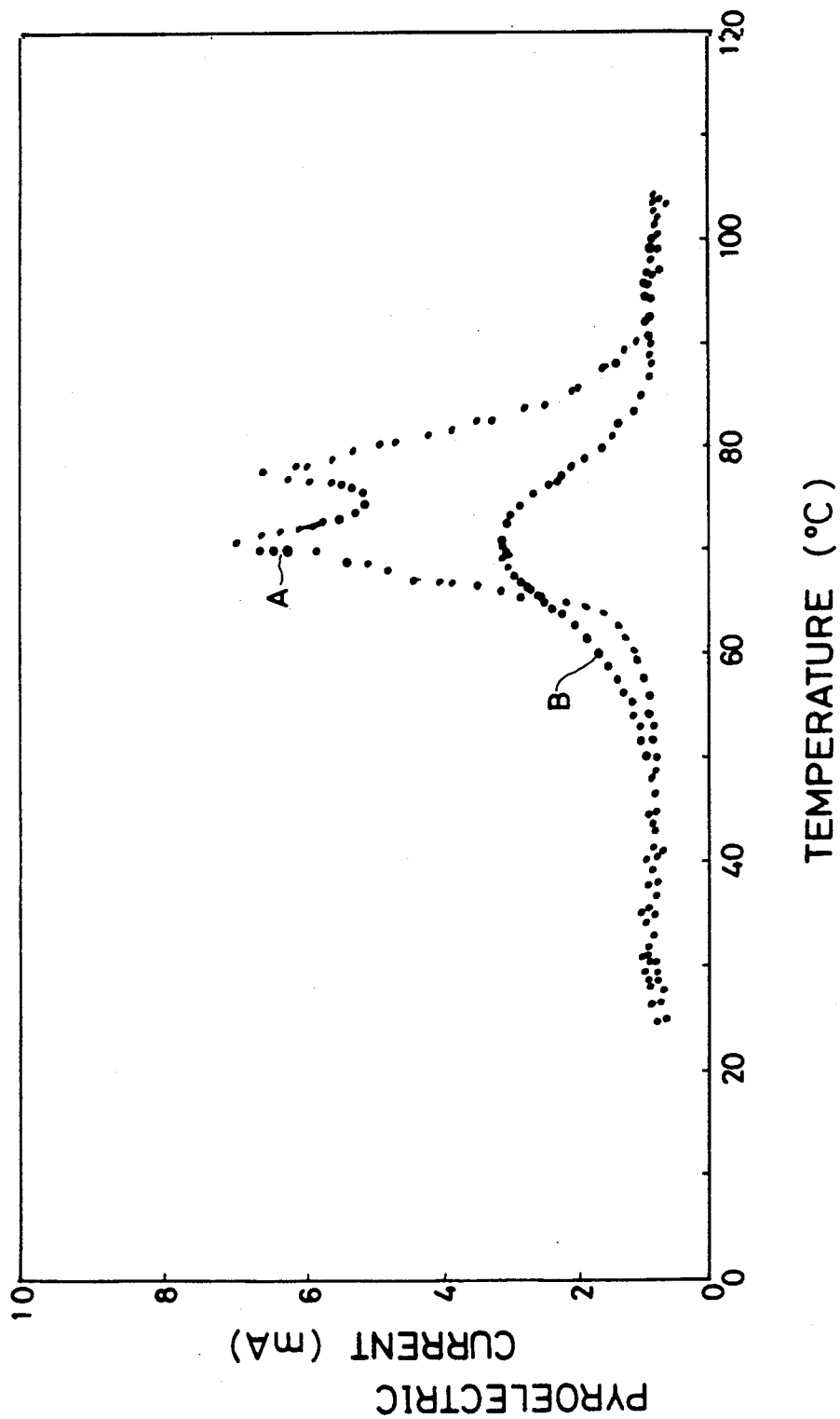

FIG. 2 is a graph showing the pyroelectric current plotted against the temperature, generated in the pyroelectric material comprising the combination of the two species having different compositions in accordance with the present invention, wherein one is by the addition of Mn and La oxides, the other is without the addition of such oxides.

DETAILED DESCRIPTION OF PREFERRED EMBODIMENTS

It is believed from the previous study of the prior art, a pyroelectric composition such as $PbZrO_3$ is a typical antiferroelectric and it involves a number of near free energy levels present in the energy structure, and therefore, the inventors have studied a variety of these kinds of the compositions and have found that a small amount of modifier can change the stabilities of a variety of characteristics and the various phases which appear.

It is clear that the composition of $PbZrO_3-PbTiO_3$ (PZT) has its maximum values for its pyroelectric constant and its dielectric constant in the neighborhood of the composition having the Zr/Ti ratio of 53/47. Inventors have paid attention to this fact, and studied for many years the $PbZrO_3$ side range of PZT composition. As a result, they have found that a specific modifier, i.e. $Pb(Zn_{\frac{1}{3}}Nb_{\frac{2}{3}})O_3$ can effect the $PbZrO_3$ side composition of PZT in that the pyroelectric composition can have a second transition temperature at which a ferroelectric crystal phase transforms into another ferroelectric crystal phase, over a wide temperature range of 0° C. to 100° C., and further, the second transition temperature is lowered with the increase of the content of this modifier.

Further, they have found that the intrinsic polarization is drastically changed at the second transition temperature. As is well known, the pyroelectric coefficient is the temperature coefficient of the intrinsic polarization. Therefore, the pyroelectric coefficient maximizes at the temperature approaching the second transition temperature, and its maximum value is one or two orders in magnitude higher than its value at the approaching temperature.

Further, they found that the dielectric constant is not any more changed in the transition temperature range, than expected. Therefore, by utilizing such phenomenon as the inventive pyroelectric composition, an infrared sensor having a sensitivity so that it can be used at specific temperatures in the range of 0° C. to 100° C., can be prepared.

The inventors studied in detail the phase diagram and all the physical properties of a composition in the neighborhood of $PbZrO_3$. They have found that a solid solution of $PbZrO_3-Pb(Zn_{\frac{1}{3}}Nb_{\frac{2}{3}})O_3$ has a second transition temperature $T_{c2}$ which changes corresponding to the content of $Pb(Zn_{\frac{1}{3}}Nb_{\frac{2}{3}})O_3$ over the wide temperature range of from the room temperature to approximately 100° C., and has a significantly high pyroelectric coefficient and a relatively low dielectric constant $\epsilon_r$ (250 to 400) at the second transition temperature, with much less temperature dependency.

They have further studied that when $Pb(Zn_{\frac{1}{3}}Nb_{\frac{2}{3}})O_3$ is added as a modifier to a solid solution of $PbZrO_3$ and $PbTiO_3$ to form the composition of $PbZrO_3-Pb(Zn_{\frac{1}{3}}Nb_{\frac{2}{3}})O_3-PbTiO_3$, the addition of Mn oxide in a small amount to such composition does not substantially change the second transition temperature, but decreases the dielectric constant. Further, the addition of La oxide would prevent the formation of solid solution of the compositions having the different content Y one from the other.

The pyroelectric performance of the composition is decided by its pyroelectric coefficient, volumetric specific heat and dielectric constant. The voltage sensitivity $(F_v)$ is $$F_v = P/C_v \epsilon_r$$

wherein P is pyroelectric coefficient, $C_v$ is volumetric specific heat, and $\epsilon_r$ is dielectric constant, and further, specific detectivity $(F_D)$ is, $$F_D = P/C_v \epsilon_r$$

tan$\delta$ wherein tan$\delta$ is dielectric loss.

Therefore, when the inventive composition is used for an infrared sensor, because the inventive composition has a high pyroelectric coefficient, a low dielectric constant and a dielectric loss, and further, has low change in its pyroelectric coefficient and dielectric constant over the wide range of from the room temperature to 100° C., the inventive composition has basic significance for the pyroelectric device.

The manufactured sensor using the inventive composition can have significantly high pyroelectric sensitivity and significant performance over the specific range of from the room temperature to 100° C.

The inventors have found that the addition of $Pb(Zn_{\frac{1}{3}}Nb_{\frac{2}{3}})O_3$ to the pyroelectric composition would improve the sintering feature of the composition when fired. The conventional pyroelectric composition needs a firing temperature of higher than 1,350° C. in general, but the inventive composition can be dense enough even when fired at a temperature below 1,250° C., and as a result the firing temperature for preparation can be lowered. Therefore, the shift of the composition due to Pb evaporation can be significantly minimized. Such shift of the composition have been a problem in firing the conventional pyroelectric material PZT.

The inventive pyroelectric structure comprising a plurality of the species each of which has the different composition of $$X-PbZrO_3-Y-Pb(Zn_{\frac{1}{3}}Nb_{\frac{2}{3}})O_3-Z-PbTiO_3$$

where $X+Y+Z=1$, $Z=0.07$, $0.82 \leq X \leq 0.93$, $0 < Y \leq 0.11$, and each of Y is different one from the other can be useful for a pyroelectric material, because such pyroelectric structure has the total pyroelectric characteristics of the combination of each of the pyroelectric species each having different compositions.

The starting materials are $PbZrO_3$, $Pb(Zn_{\frac{1}{3}}Nb_{\frac{2}{3}})O_3$ and $PbTiO_3$. Those materials can be prepared from each component, that is, metal inorganic salt such as oxide, carbonate, and sulphate, hydroxide, metal alkoxide and organic metal compounds, or complex oxide such as $ZrTiO_3$. Alternatively, the powders of $PbZrO_3$, $PbTiO_3$, and $Pb(Zn_{\frac{1}{3}}Nb_{\frac{2}{3}})O_3$ can be used to be mixed for the preparation of the green body in the desired ratio.

The starting materials for the preparation of the inventive pyroelectric composition can be prepared by mixing several starting materials in the predetermined ratio, firing to produce the fired powder, and then, forming a shape from the fired powder, and firing in an atmospheric pressure, and milling the fired shape to produce the starting materials for the preparation of the inventive composition. The oxides such as $PbO$, $Pb_3O_4$ and $PbCO_3$ and its salts can be used to prepare the starting materials. The inorganic salts such as oxides, carbonates, and sulfates; and hydroxide, alkoxide compounds and organic metal compounds of the other constituting elements such as Zr, Zn, Nb and Ti can be used by heating to decompose those compounds into the desired oxides and the desired complex oxides such as $ZrTiO_3$.

The powders of $PbZrO_3$, $Pb(Zn_{\frac{1}{3}}Nb_{\frac{2}{3}})O_3$, and $PbTiO_3$ can be prepared by the above-mentioned method, and can be used in the predetermined ratio for the preparation of the desired pyroelectric composition.

Such starting powders are mixed with an organic binder and plasticizer and then followed by adding a solvent, and mixing in a ball mill to yield a uniform slurry of the pyroelectric composition. The slurry is then cast on the surface of a polyester film, and a green sheet is formed by using a doctor blade, or molding. The green sheet is then fired in a magnesia sheath in a furnace by controlling PbO vapor in the furnace.

The voltage of several kV/mm is applied to the resulting fired body so as to polarize the pyroelectric element. The firing condition such as a firing temperature, an applying voltage to polarize the element should be selected appropriately in view of the composition of the starting materials, and the particle size of the composition.

Preferably, the inventive new pyroelectric composition can be used in a variety of applications including: 1) accident prevention and such invasion detector; 2) fire detector; 3) automatic opening and closing system for a door, a curtain and a shutter; 4) automatic lighting, on and off system; 5) detection of vehicles passing by; 6) radiation thermometer; 7) detector of the temperature distribution; 8) non-contacting temperature detector used in electric cooking range and a laser power meter; and 9) pyrovision.

The present invention is further illustrated by the following examples to show manufacture of the inventive pyroelectric composition, but should not be interpreted for the limitation of the invention.

EXAMPLE 1

PREPARATION OF PYROELECTRIC MATERIAL

Powders of $PbTiO_3$, $PbZrO_3$; $PbO$, $ZnO$, and $Nb_2O_3$ having the particle size of 0.5 microns in average, and the purity of about 99.5% were used as starting materials, in the predetermined molar ratios of $PbTiO_3$, $PbZrO_3$; $PbO$, $ZnO$, and $Nb_2O_3$, each of which is respectively corresponding to the predetermined composition of the formula:

$$X-PbZrO_3-Y-Pb(Zn_{\frac{1}{3}}Nb_{\frac{2}{3}})O_3-Z-PbTiO_3$$

where $X+Y+Z=1$, $Z=0.07$, $0.82 \leq X \leq 0.93$, $0 < Y < 0.11$ and Y is changed to be 0, 0.05, 0.07, 0.09 and 0.11 (0, 5, 7, 9 and 11 mole percent), and mixed in a ball mill using acetone media and milled in the ball mill for 24 hours to produce the uniform mixture.

Then, the mixture was put in a pad, and dried and fired at 820° C. for two hours, and further, put in a ball mill and milled for 15 hours in wet state, and dried to produce a dried mixture of grain size of below 0.5 microns. Then, the dried mixture was molded into a disc 1 mm thick, under the pressure of 840 kg/cm².

Then, the shaped disc was calcined for three hours at 1,250° C., by elevating the temperature in 2° C./minute to 1,250° C. and maintaining that temperature for three hours.

Next, the silver electrode was stoved on the surface of the resulting disc at 550° C. for the measurement of pyroelectric properties. Further, the sample was polarized by applying 2 kV/mm for 30 minutes under the temperature of 120° C.

Then, the aging of the resulting sample was carried out by making short-circuit between the electrodes, and maintaining the sample in a constant temperature bath at the temperature of 90° C. for 12 hours. The dielectric properties and pyroelectric coefficient were measured by using an impedance analyzer and pico-ampere meter. The result is shown in Table 1 listing the content (Y) of $(Zn_{\frac{1}{3}}Nb_{\frac{2}{3}})$ in mole percent, Curie's temperature ($T_{c1}$), the second transition temperature of rhombohedral system ($T_{c2}$), the dielectric constant ($\epsilon_r$), dielectrode loss tangent (tan$\delta$), intrinsic polarization ($P_s$), the pyroelectric coefficient (P).

Respective properties of each of the pyroelectric composition of $PbZr_x(Zn_{\frac{1}{3}}Nb_{\frac{2}{3}})_yTi_{0.07}O_3$ where Y is in the range of 0 to 0.11 (11 mole percent) is listed in Table 1.

TABLE 1

| Y mol % | $T_{c1}$ (°C.) | $T_{c2}$ (°C.) | $\epsilon_r$ | Tan$\delta$ (%) | $P_s$ (micro/cm$^2$) | P (nc/cm$^2$) |
|---|---|---|---|---|---|---|
| 0 | 254 | 71 | 501 | 1.1 | 45.8 | 26.2 |
| 5 | 242 | 78 | 364 | 3.4 | 38.6 | 27.6 |
| 7 | 244 | 75 | 407 | 3.8 | 38.0 | 28.3 |
| 9 | 244 | 72 | 400 | 3.8 | 38.8 | 30.0 |
| 11 | 242 | 68 | 419 | 3.9 | 40.2 | 32.8 |

Figure 1:
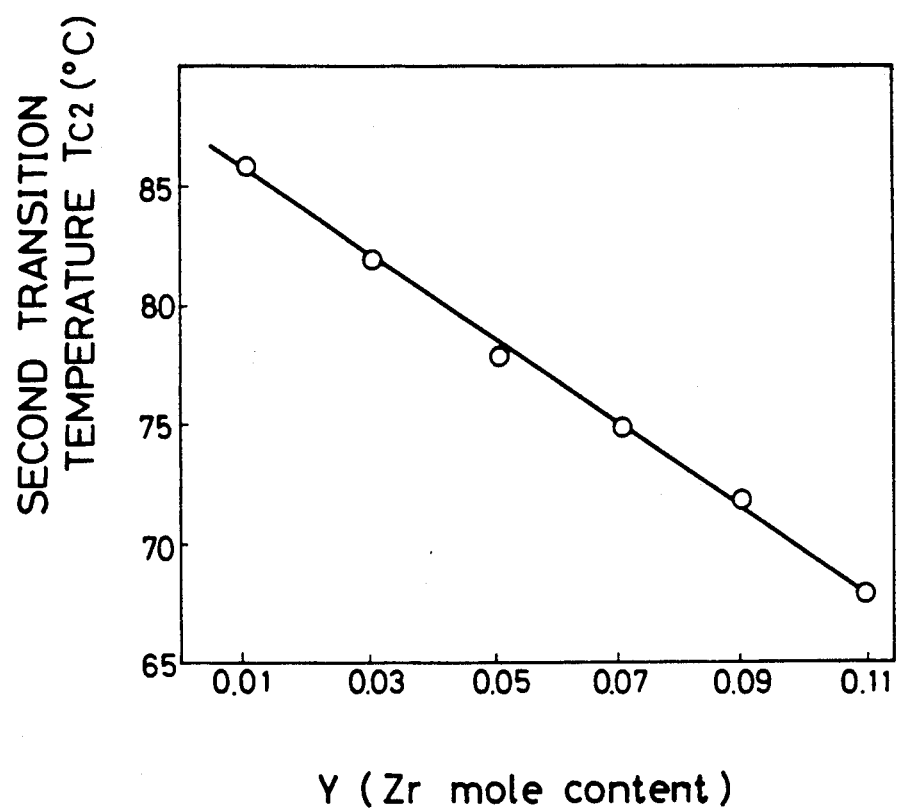
FIG. 1 is a graph showing the relation of the second transition temperature $T_{c2}$ to the content of $Pb(Zn_{\frac{1}{3}}Nb_{\frac{2}{3}})O_3$ (Y) in the inventive pyroelectric composition of the formula.

As shown in Table 1, Curie's temperature $T_{c1}$ does not change so much with the change of the content (Y) and is approximate to 250° C. The second transition temperature $T_{c2}$ calculated from the pyroelectric current curve plotted to the temperature shifts to the lower side with the increase of Y mole percent as shown in FIG. 1. On the other hand, the intrinsic polarization $P_s$ and the pyroelectric coefficient P are increased with the increase of the content Y mol percent.

The pyroelectric composition of the present invention has the second transition temperature which is increased from the room temperature to 100° C., with the increase of the content Y, and then the desired second transition temperature can be obtained by adjusting the content Y. Further, in the range of from the room temperature to 100°, the pyroelectric coefficient can be improved to the raise of one or two order.

In the composition of the formula:

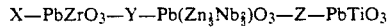

where $X+Y+Z=1$, $Z=0.07$, $0.82 \leq X \leq 0.93$, $0 < Y \leq 0.11$ and X is changed in the range of 0.82 to 0.93, the second transition temperature can be obtained in the same range of the room temperature to 100° C. Therefore, the inventive pyroelectric composition can be useful in an infrared sensor for use in measuring the temperature within the room temperature range.

Because the inventive pyroelectric composition can give high pyroelectric current in the wide temperature range, the infrared pyroelectric sensor using the inventive composition can be readily miniaturized and can be used in severe condition without any affection of envelopmental condition.

EXAMPLE 2

PREPARATION OF PYROELECTRIC MATERIAL

Powders of $PbTiO_3$, $PbZrO_3$; PbO, ZnO, $Nb_2O_3$:-ZnO, $Nb_2O_3$, $MnO_2$, and $La_2O_3$ having the purity of about 99.5% were used as starting materials, in the predetermined molar ratio, each of which is respectively corresponding to the predetermined composition of the formula:

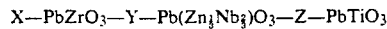

where X, Y and Z are respectively the same to those in Example 1, and mixed in a ball mill using acetone media and milled in the ball mill to produce the uniform mixture.

Then, the mixture was dried and pressed into a shape under 800 kg/cm$^2$ in a dry state, and fired at 820° C. for two hours. The fired body was milled again in a ball mill in a wet state, and molded into a disc shape under the pressure of 840 kg/cm$^2$.

For comparison, the composition with addition of $MnO_2$, and $La_2O_3$ was used to produce similarly the pyroelectric structures in accordance with the above-mentioned method.

Then, each of the shaped discs was calcined for three hours at 1,250° C., by elevating the temperature in 2° C./minute to 1,250° C. and maintaining that temperature for three hours in a magnesia tube.

Next, the silver electrode was stoved on the surface of each of the resulting disc of 1 mm in thickness at 550° C. for the measurement of pyroelectric properties. Further, the sample was polarized by applying 2 kV/mm between the electrodes for 30 minutes under the temperature of 120° C.

Then, the aging of the resulting sample was carried out by making short-circuit between the electrodes, and maintaining the sample in a constant temperature bath at the temperature of 90° C. for 12 hours. The dielectric properties and pyroelectric coefficient were measured by using an impedance analyzer and pico-ampere meter.

The result is shown in Table 1 listing the content (Y) of in the composition of:

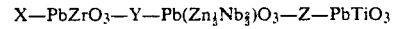

where Z is 0.07 (7 mol percent), Y is changed to be in the range of from 0 to 0.11 (11 mol percent), i.e. to be 0, 0.05, 0.07, 0.09 and 0.11 (corresponding to 0, 5, 7, 9, and 11 mole percent). Curie's temperature ($T_{c1}$), the second transition temperature of the rhombohedral system ($T_{c2}$), the dielectric constant ($\epsilon_r$), dielectric loss tangent (tan$\delta$), intrinsic polarization ($P_s$), the pyroelectric coefficient (P).

Further, the samples of Nos. 6 to 9 indicate the result from the composition containing additionally Mn oxide and/or La oxide.

Respective properties of each of the pyroelectric composition of:

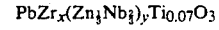

where Y is in the range of 0 to 0.11 (11 mole percent) are listed in Table 2.

TABLE 2

| | | | Pyroelectric Composition and Physical Properties | | | | | |
|---|---|---|---|---|---|---|---|---|
| No | Y mol % | $MnO_2$ mol % | $La_2O_3$ mol % | $T_{c1}$ (°C.) | $T_{c2}$ (°C.) | $\epsilon_r$ | Tan$\delta$ (%) | $P_s$ (micro/cm$^2$) | P (nc/cm$^2$) |
| 1 | 0 | — | — | 254 | 71 | 501 | 1.1 | 45.8 | 26.2 |
| 2 | 5 | — | — | 242 | 78 | 364 | 3.4 | 38.6 | 27.6 |
| 3 | 7 | — | — | 244 | 75 | 407 | 3.8 | 38.0 | 28.3 |
| 4 | 9 | — | — | 244 | 72 | 400 | 3.8 | 38.8 | 30.0 |
| 5 | 11 | — | — | 242 | 68 | 419 | 3.9 | 40.2 | 32.8 |
| 6 | 5 | 1 | — | 226 | 79 | 210 | 0.46 | 44.0 | 32.8 |

TABLE 2-continued

| | | | | | Pyroelectric Composition and Physical Properties | | | |
|---|---|---|---|---|---|---|---|---|
| No | Y mol % | MnO$_2$ mol % | La$_2$O$_3$ mol % | T$_{c1}$ (°C.) | T$_{c2}$ (°C.) | $\epsilon_r$ | Tan$\delta$ (%) | P$_s$ (micro/cm$^2$) | P (nc/cm$^2$) |
| 7 | 9 | 1 | — | 227 | 73 | 190 | 0.51 | 45.5 | 36.0 |
| 8 | 5 | 1 | 1 | 238 | 77 | 300 | 3.1 | 39.0 | 28.0 |
| 9 | 9 | 1 | 1 | 239 | 72 | 370 | 3.3 | 39.0 | 32.8 |

As shown in Table 2, Curie's temperature T$_{c1}$ does not change so much with the change of the content (Y) and is approximate to 250° C. The second transition temperature T$_{c2}$ calculated from the pyroelectric current curve plotted to the temperature shifts to the lower side with the increase of Y mole percent as shown in FIG. 1. On the other hand, the intrinsic polarization P$_s$ and the pyroelectric coefficient P are increased with the increase of the content Y mol percent.

EXAMPLE 3

COMBINATION OF PYROELECTRIC MATERIAL

Next, the two species of the selected samples (calcined powders) listed in Table 2 were mixed and molded. Then, the molded bodies which respectively comprises two species of the powders were respectively fired to prepare the two samples, and the samples were polarized and measured on pyroelectric current against the change of temperature. The sample A is the combination of the fired powders Nos. 8 and 9, that is, the MnO$_2$ and La$_2$O$_3$ added pyroelectric powders were mixed in an equivalent molar ratio, and molded into a disc as mentioned in Examples 1 and 2. Then, the disc, comprising the two species powders, was measured for the pyroelectric current against the temperature change. The result is shown by the curve A in FIG. 2.

Similarly, the fired powders Nos. 2 and 4 were used to prepare a pyroelectric disc, which was polarized and measured for the pyroelectric current change against the temperature.

FIG. 2 shows a graph showing the pyroelectric current plotted against the temperature in regard to the samples A and B prepared from the compositions, one of which (A) is the combination of the powders Nos. 8 and 9, and the other of which (B) is the combination of powders Nos. 2 and 4. The combination was prepared by mixing the equivalent mole of each the starting powders.

Therefore, the curve A of FIG. 2 is the result of the composition to which MnO$_2$ and La$_2$O$_3$ had been added, and the curve B of FIG. 2 is the result from no addition of MnO$_2$ and La$_2$O$_3$.

The dielectric constant ($\epsilon_r$), and dielectric loss tangent (tan$\delta$) of the composition containing additionally Mn and La oxides are lowered significantly as compared with the mere composition without addition of Mn and La oxide. Therefore, the voltage sensitivity and detectivity of the pyroelectric material can be significantly improved and then such pyroelectric composition is very useful for an infrared sensor.

In consideration of the result shown in FIG. 2, the addition of Mn and/or La oxides seems to prevent the solid solution formation during the firing step of the combined powder structure, i.e. minimizes solid melting between the particles of the compositions, and therefore, the result of the pyroelectric current curve plotted against the temperature is only the total combination of the results resulting from each of the independent fired powder disc.

Accordingly, the pyroelectric material having the desired pyroelectric properties can be obtained by combining the different pyroelectric compositions each of which has the second transition temperature at appropriate temperature and preparing the fired body from the combined powder. Therefore, the pyroelectric material obtained can have temperature independency to the pyroelectric properties, and improve significantly the practicality of the pyroelectric sensor. The performance of the resulting pyroelectric material can have significance of pyroelectricity.

In such preparation of the inventive combined structure, a preparatory firing step for the each composition powder is necessary, and enough mixing of the fired powders should be carried out.

It is clear that when the inventive pyroelectric composition and the combination thereof is used in an infrared sensor, the device can be miniaturized, and can be used in the wider range of the measuring temperature, with high sensitivity.

As described in the foregoing, the inventive ceramic pyroelectric composition and the combination thereof will enable one to produce a miniature device to detect infrared radiation or temperature at a position apart from the device.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalence of the claims are therefore intended to be embraced therein.

We claim:

1. A pyroelectric ceramic composition comprising a mixture of at least two different species of solid solution fired particulate materials, each species being a pyroelectric composition of the general formula:

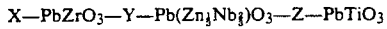

where $X+Y+Z=1$, $Z=0.07$, $0.82 \leq X \leq 0.93$, $0 < Y \leq 0.11$, and each species has both a high pyroelectric constant and a second transition temperature below its Curie's temperature.

2. A pyroelectric ceramic composition in accordance with claim 1, wherein each species further comprises manganese oxide, lanthanum oxide or combinations thereof in an amount of up to 1 molar percent.

* * * * *